(12) United States Patent
Chin et al.

(10) Patent No.: US 9,799,512 B1
(45) Date of Patent: Oct. 24, 2017

(54) SEMICONDUCTOR SUBSTRATE STRUCTURES AND METHODS FOR FORMING THE SAME

(71) Applicant: Vanguard International Semiconductor Corporation, Hsinchu (TW)

(72) Inventors: Yu-Lung Chin, Tainan (TW); Shin-Cheng Lin, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/361,140

(22) Filed: Nov. 25, 2016

(51) Int. Cl.
*H01L 21/02* (2006.01)
*H01L 29/20* (2006.01)
*H01L 29/32* (2006.01)

(52) U.S. Cl.
CPC .... *H01L 21/0254* (2013.01); *H01L 21/02617* (2013.01); *H01L 21/02634* (2013.01); *H01L 21/02639* (2013.01); *H01L 21/02645* (2013.01); *H01L 29/2003* (2013.01); *H01L 29/32* (2013.01); *H01L 21/0262* (2013.01); *H01L 21/02631* (2013.01)

(58) Field of Classification Search
CPC ........... H01L 21/0254; H01L 21/02645; H01L 21/02639; H01L 21/02617; H01L 21/02634
See application file for complete search history.

(56) References Cited

U.S. PATENT DOCUMENTS

| 2003/0143771 | A1* | 7/2003 | Kidoguchi | H01L 21/0237 438/46 |
| 2003/0180977 | A1* | 9/2003 | Suzuki | H01L 33/18 438/22 |
| 2005/0211291 | A1* | 9/2005 | Bianchi | H01L 31/02246 136/255 |
| 2010/0176490 | A1* | 7/2010 | Letertre | H01L 21/02367 257/615 |
| 2012/0267639 | A1* | 10/2012 | Jeon | H01L 29/0607 257/76 |

FOREIGN PATENT DOCUMENTS

| CN | 101390201 A | 3/2009 |
| TW | 548720 B | 8/2003 |

* cited by examiner

*Primary Examiner* — Douglas Menz
(74) *Attorney, Agent, or Firm* — Birch, Stewart, Kolasch & Birch, LLP (57) ABSTRACT

A semiconductor substrate structure includes a seed layer on a substrate, a first gallium nitride layer on the seed layer, and a patterned first hard mask layer on the first gallium nitride layer, wherein the patterned first hard mask layer includes a first opening. The semiconductor substrate structure also includes a second gallium nitride layer in the first opening and on the patterned first hard mask layer, a patterned second hard mask layer on the second gallium nitride layer, wherein the patterned second hard mask layer includes a second opening, and at least a portion of a projection on the substrate of the first opening and a projection on the substrate of the second opening are non-overlapped. The semiconductor substrate structure further includes a third gallium nitride layer in the second opening and on the patterned second hard mask layer.

15 Claims, 7 Drawing Sheets

SEMICONDUCTOR SUBSTRATE STRUCTURES AND METHODS FOR FORMING THE SAME

BACKGROUND OF THE INVENTION

Field of the Invention

The invention relates to structures of semiconductor substrates, and in particular to structures of semiconductor substrates including an epitaxial grown gallium nitride (GaN) layer and methods for forming the same.

Description of the Related Art

As a semiconductor material, gallium nitride has properties such as wide band gap (WBG), high electron mobility, high electron saturation velocity, high thermal conductivity and high chemical stability. Therefore, gallium nitride is an ideal material for devices such as blue light emitting diodes (LEDs), blue-violet laser diodes (LDs), gallium nitride power high electron mobility transistors (pHEMT) and high frequency amplifiers.

Traditionally, since the lattice constants of gallium nitride and silicon substrates are different, the problem of lattice mismatch is easily occurred in epitaxial growth process for gallium nitride on the silicon substrate. Besides, the difference of thermal expansion coefficients of gallium nitride and silicon substrates is another cause. Because of the foregoing reasons, a gallium nitride epitaxial layer with high dislocation density is easily formed during the process of epitaxially growing gallium nitride on the silicon substrate, which means that there are lots of line dislocations defects which are perpendicular to the surface of the substrate and penetrated through the gallium nitride layer exist in the gallium nitride layer. Such a huge amount of the dislocations will continuously grow to the surface gallium nitride, and the efficiency of the devices produced in the following manufacturing steps may be significantly decreased. Moreover, the semiconductor substrate may be broken due to the dislocation problem.

Although existing structures of semiconductor substrate including an epitaxial grown gallium nitride layer and methods for forming the same have been adequate for their intended purposes, they have not been entirely satisfactory in all respects. Therefore, to overcome the problem of high dislocation density in the gallium nitride layer of the semiconductor substrate is the main purpose so far.

BRIEF SUMMARY OF THE INVENTION

Embodiments of structures of semiconductor substrate and methods for forming the same are provided. At least two interlaced patterned hard mask layers are used when gallium nitride layers are epitaxially grown, so that the dislocations caused by lattice mismatch can be blocked, which means that the dislocations defects cannot extend upward into the surface gallium nitride layer. Thus, the amount of the defects inside the surface gallium nitride layer can be decreased, and the efficiency and reliability of the devices produced in the following manufacturing steps can be enhanced.

Some embodiments of the disclosure provide a semiconductor substrate structure. The semiconductor substrate structure includes a seed layer disposed on a substrate. The semiconductor substrate structure also includes a first gallium nitride layer disposed on the seed layer. The semiconductor substrate structure further includes a patterned first hard mask layer disposed on the first gallium nitride layer, wherein the patterned first hard mask layer includes a first opening. In addition, the semiconductor substrate structure includes a second gallium nitride layer disposed in the first opening and on the patterned first hard mask layer. The semiconductor substrate structure also includes a patterned second hard mask layer disposed on the second gallium nitride layer, wherein the patterned second hard mask layer includes a second opening, and at least a portion of a projection on the substrate of the first opening and a projection on the substrate of the second opening are non-overlapped. The semiconductor substrate structure further includes a third gallium nitride layer disposed in the second opening and on the patterned second hard mask layer.

Some embodiments of the disclosure provide a method for forming a semiconductor substrate structure. The method includes forming a seed layer on a substrate. The method also includes epitaxially growing a first gallium nitride layer on the seed layer. The method further includes forming a patterned first hard mask layer on the first gallium nitride layer, wherein the patterned first hard mask layer includes a first opening. In addition, the method includes epitaxially growing a second gallium nitride layer in the first opening and on the patterned first hard mask layer. The method also includes forming a patterned second hard mask layer on the second gallium nitride layer, wherein the patterned second hard mask layer includes a second opening, and at least a portion of a projection on the substrate of the first opening and a projection on the substrate of the second opening are non-overlapped. The method further includes epitaxially growing a third gallium nitride layer in the second opening and on the patterned second hard mask layer.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor substrate structure are provided. FIGS. 1A to 1J are cross-sectional views illustrating an exemplary sequential forming process of a semiconductor substrate structure 100a of FIG. 1J in accordance with some embodiments of the present disclosure.

Figure 1A:
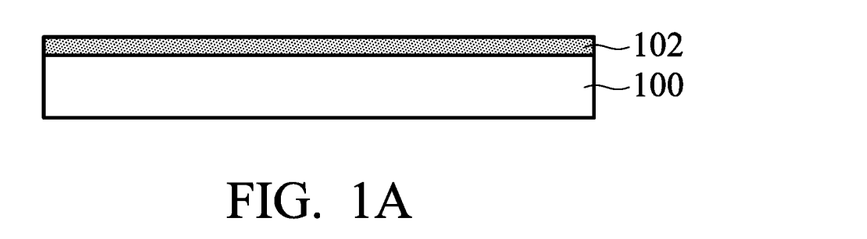
FIGS. 1A to 1J are cross-sectional views illustrating an exemplary sequential forming process of a semiconductor substrate structure in accordance with some embodiments of the present disclosure.

As shown in FIG. 1A, a seed layer 102 is formed on a substrate 100, in accordance with some embodiments. The substrate 100 may be made of silicon, silicon carbide (SiC), gallium nitride (GaN), silicon dioxide (SiO$_2$), sapphire, or a combination thereof. In some embodiments, the seed layer 102 is formed by using a metal organic chemical vapor deposition (MOCVD), a molecular beam epitaxy (MBE), or a combination thereof. The seed layer 102 may be made of aluminium nitride (AlN), aluminium oxide (Al$_2$O$_3$), aluminum gallium nitride (AlGaN), silicon carbide (SiC), aluminium, or a combination thereof. In some embodiments, the seed layer 102 is a multi-layer structure.

Figure 1B:
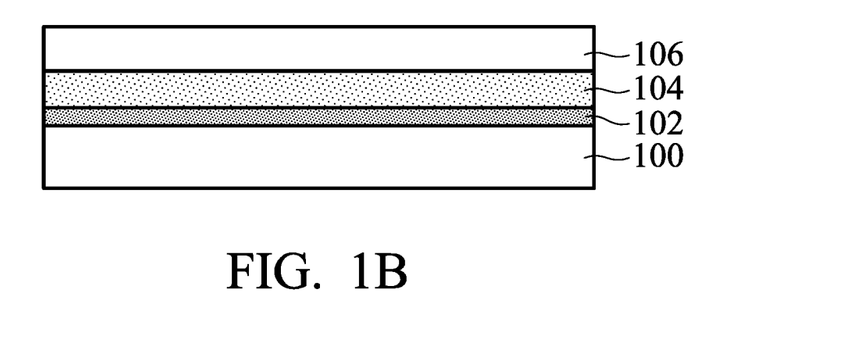

Next, as shown in FIG. 1B, a buffer layer 104 is formed on the seed layer 102, and a first gallium nitride layer 106 is formed on the buffer layer 104. In some embodiments, the buffer layer 104 and the first gallium nitride layer 106 are respectively formed by using a metal organic chemical vapor deposition (MOCVD), a molecular beam epitaxy (MBE), or a combination thereof. The material of the buffer layer 104 is selected according to the material of the seed layer 102 and the gas introduced during the epitaxial growth processes of the seed layer 102 and the first gallium nitride layer 106. In some embodiments, the buffer layer 104 may be made of aluminium nitride (AlN), gallium nitride (GaN), aluminum gallium nitride (AlGaN), aluminium gallium indium nitride (InAlGaN), or a combination thereof. In some embodiments, the buffer layer 104 may be a multi-layer structure doped with carbon, silicon, magnesium or iron. In some embodiments, the thickness of the buffer layer 104 is in a range from about 5 nm to about 100 nm, the thickness of the first gallium nitride layer 106 is in a range from about 100 nm to about 2 μm. The first gallium nitride layer 106 is epitaxially grown in a temperature range from about 800° C. to about 1150° C.

Figure 1C:
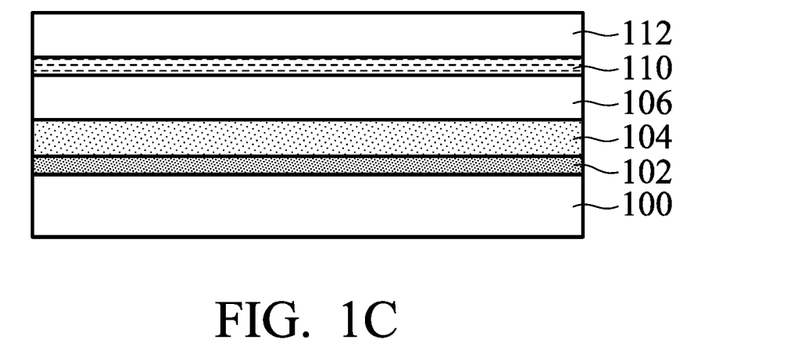

As shown in FIG. 1C, a first hard mask layer 110 is formed on the first gallium nitride layer 106, and a first photoresist layer 112 is formed on the first hard mask layer 110. In some embodiments, the first hard mask layer 110 is made of silicon nitride (SiN), silicon dioxide (SiO$_2$), silicon oxynitride (SiON), or a combination thereof. In some embodiments, the first hard mask layer 110 is formed by using a thermal oxidation, a chemical vapor deposition (CVD), a high-density plasma chemical vapor deposition (HDPCVD), an atomic layer deposition (ALD), a spin coating, a sputtering, a metal organic chemical vapor deposition (MOCVD), or a combination thereof. The thickness of the first hard mask layer 110 is in a range from about 5 nm to about 500 nm.

Figure 1D:
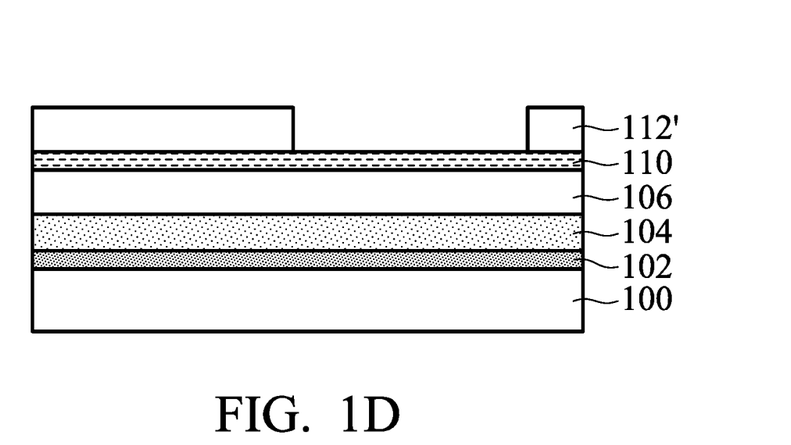

Then, as shown in FIG. 1D, the first photoresist layer 112 is patterned by performing a photolithography process in order to form a patterned first photoresist layer 112'. In some embodiments, the photolithography process includes photoresist coating (e.g., spin-on coating), soft baking, mask aligning, exposure, post-exposure baking, developing the photoresist, rinsing and drying (e.g., hard baking).

Figure 1E:
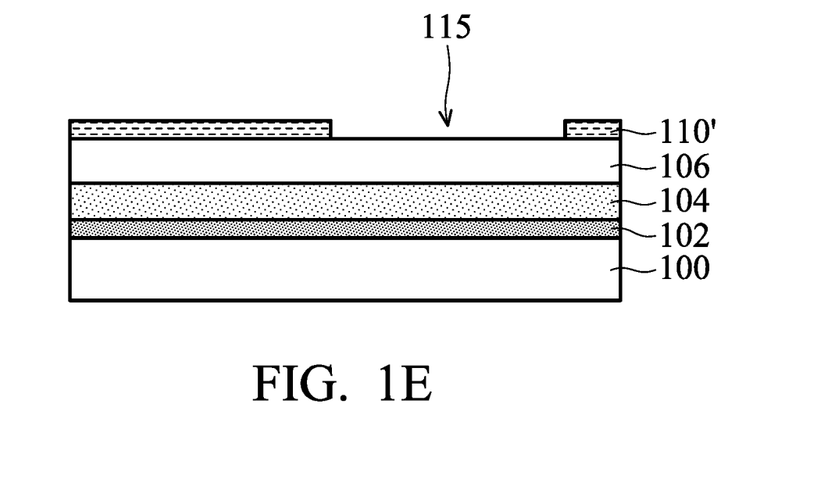

As shown in FIG. 1E, the first hard mask layer 110 is etched and patterned by using the patterned first photoresist layer 112' as a mask, in accordance with some embodiments. In some embodiments, the etching process includes a dry etching process or a wet etching process. After forming a patterned first hard mask layer 110', the patterned first photo resist layer 112' is removed. The patterned first hard mask layer 110' includes a first opening 115, and a portion of the first gallium nitride layer 106 is exposed by the first opening 115. In some embodiments, a diameter of the first opening 115 is in a range from about 0.1 μm to about 10 μm.

Figure 1F:
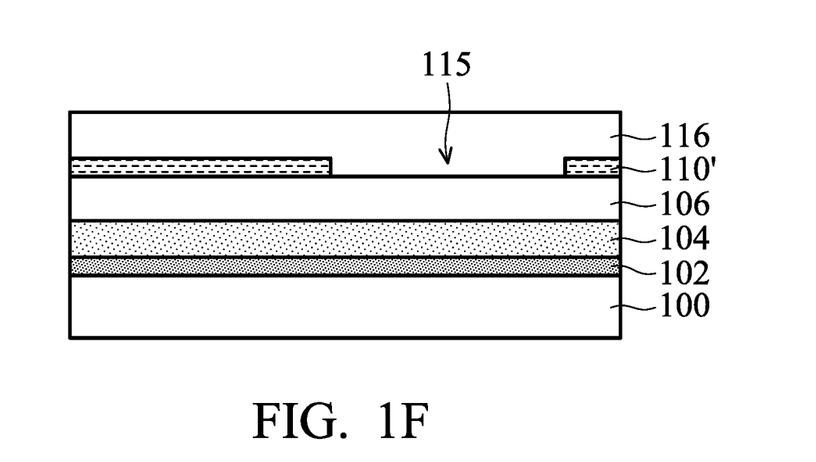

Next, as shown in FIG. 1F, a second gallium nitride layer 116 is epitaxially grown upward from the portion of the first gallium nitride layer 106 exposed by the first opening 115. The grains of the second gallium nitride layer 116 inside the first opening 115 are sequentially grown through nucleation and island growth, and then lateral growth onto the patterned first hard mask layer 110'. During the epitaxial growth process, the dislocations defects inside the portion of the first gallium nitride layer 106, which is not exposed by the first opening 115 (i.e. the portion covered by the patterned first hard mask layer 110'), are blocked by the patterned first hard mask layer 110', so that the dislocations defects cannot continuously grow upward. Therefore, the dislocation density of the second gallium nitride layer 116 is lower than the dislocation density of the first gallium nitride layer 106. In some embodiments, the thickness of the second gallium nitride layer 116 is in a range from about 100 nm to about 2 μm.

Figure 1G:
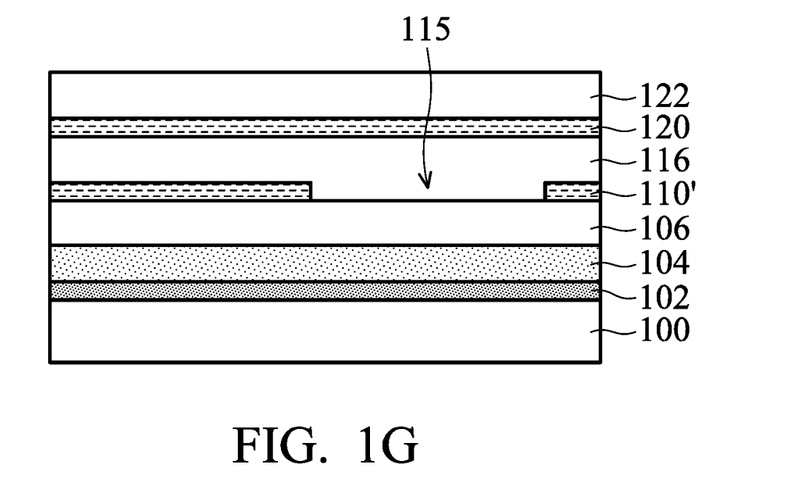

As shown in FIG. 1G, a second hard mask layer 120 is formed on the second gallium nitride layer 116, and a second photoresist layer 122 is formed on the second hard mask layer 120, in accordance with some embodiments. Some processes and materials used to form the second hard mask layer 120 and the second photoresist layer 122 are similar to, or the same as, those used to form the first hard mask layer 110 and the first photoresist layer 112 and are not repeated herein. In some embodiments, the thickness of the second hard mask layer 120 is in a range from about 5 nm to about 500 nm.

Figure 1H:
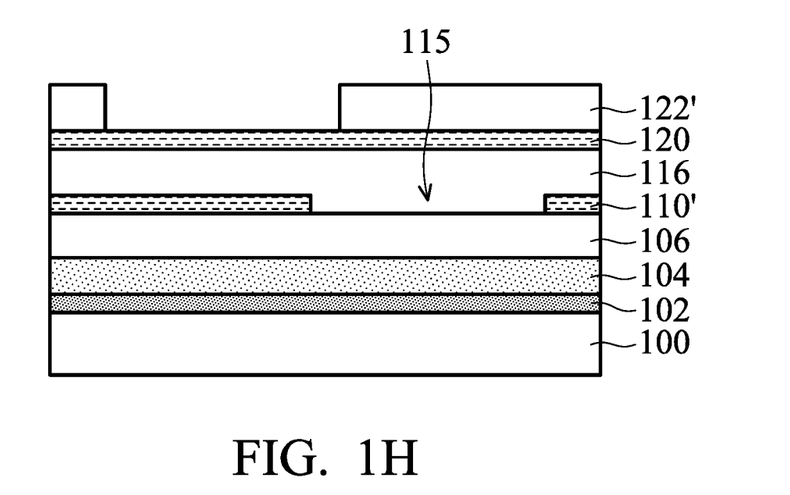

As shown in FIG. 1H, the second photoresist layer 122 is patterned to form a patterned second photoresist layer 122'. Some processes and materials used to form the patterned second photoresist layer 122' are similar to, or the same as, those used to form the patterned first photoresist layer 112' and are not repeated herein.

Figure 1I:
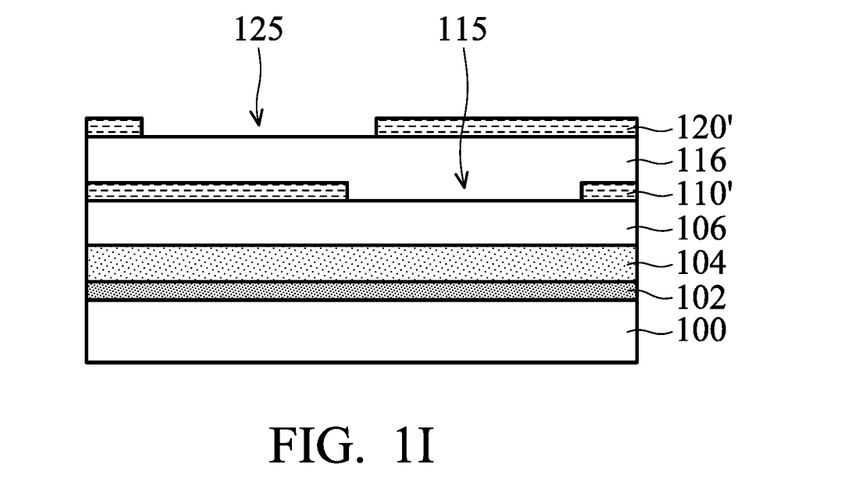

Then, as shown in FIG. 1I, the second hard mask layer 120 is etched and patterned by using the patterned second photoresist layer 122' as a mask. After forming a patterned second hard mask layer 120', the patterned second photo resist layer 122' is removed. The patterned second hard mask layer 120' includes a second opening 125, and a portion of the second gallium nitride layer 116 is exposed by the second opening 125. In some embodiments, at least a portion of the projections on the substrate 100 of the first opening 115 and the projections on the substrate 100 of the second opening 125 are non-overlapped.

Figure 1J:
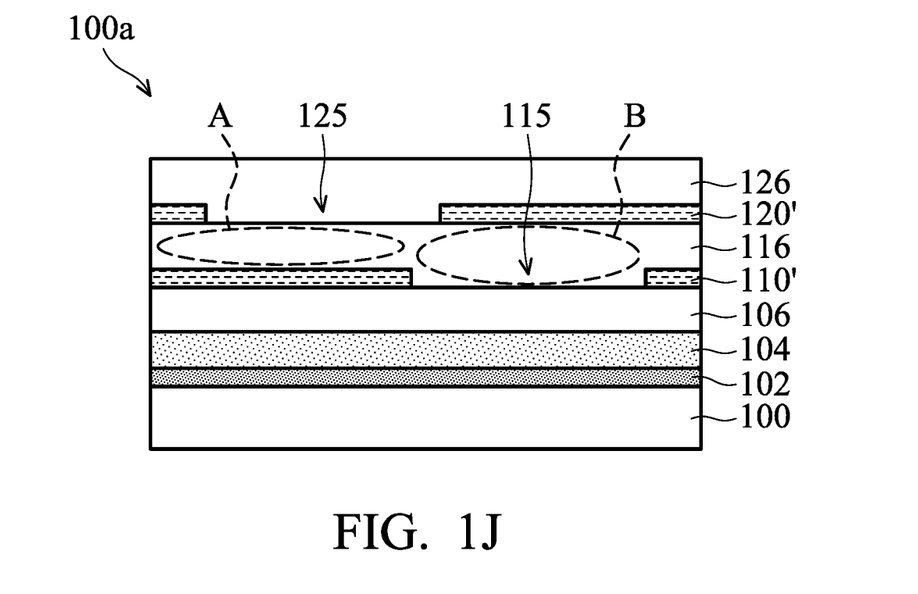

As shown in FIG. 1J, a third gallium nitride layer 126 is epitaxially grown upward from the portion of the second gallium nitride layer 116 exposed by the second opening 125 (i.e. area A), wherein the dislocation density of an area A of the second gallium nitride layer 116 is lower than the dislocation density of an area B of the second gallium nitride layer 116. The grains of the third gallium nitride layer 126 inside the second opening 125 are sequentially grown through nucleation and island growth, and then lateral growth onto the patterned second hard mask layer 120'. During the epitaxial growth process, the dislocations defects inside the portion of the second gallium nitride layer 116, which is not exposed by the second opening 125 (i.e. the portion covered by the patterned second hard mask layer 120' (the area B)), are blocked by the patterned second hard mask layer 120', so that the dislocations defects cannot continuously grow upward. Moreover, since the third gallium nitride layer 126 epitaxially grown in the second opening 125 is formed above the area A of the second gallium nitride layer 116, and the area A has a lower dislocation density than the area B, the dislocation density of the third gallium nitride layer 126 is lower than the dislocation density of the second gallium nitride layer 116.

Since at least a portion of the projections on the substrate 100 of the first opening 115 of the patterned first hard mask layer 110' and the projections on the substrate 100 of the second opening 125 of the patterned second hard mask layer 120' are non-overlapped, a portion of the dislocations defects, which is not blocked by the patterned first hard mask layer 110' (i.e. the dislocations penetrated through the first opening 115 and grown upward into the second gallium nitride layer 116), are blocked by the patterned second hard mask layer 120'. Therefore, the portion of the dislocations defects cannot continuously grow into the third gallium nitride layer 126. During the process which the grains of gallium nitride are epitaxially grown from the first gallium nitride layer 106 to the third gallium nitride layer 126, the dislocation density is significantly decreased whenever the dislocations are blocked by a patterned hard mask layer. Thus, the closer to the surface gallium nitride layer, the more perfect crystals it has. Therefore, an ideal effect of dislocation free can be fulfilled.

Figure 2:
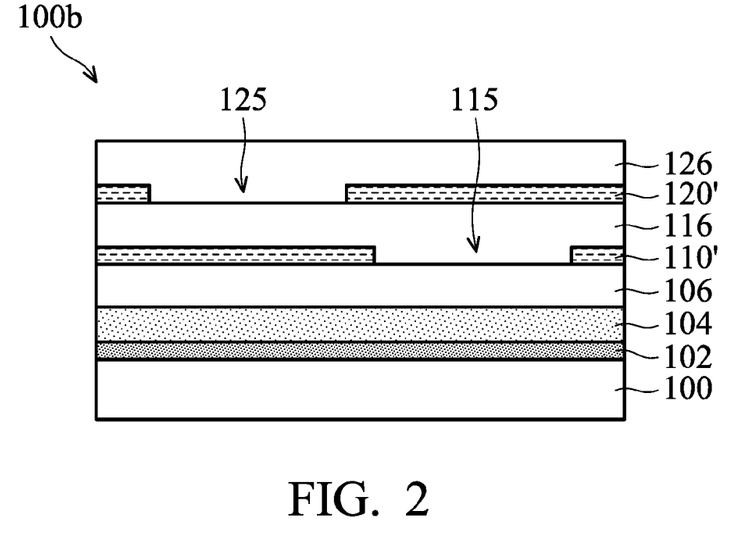
FIG. 2 is a cross-sectional view of a semiconductor substrate structure in accordance with some embodiments of the present disclosure.

FIG. 2 is a cross-sectional view of a semiconductor substrate structure 100b in accordance with some embodiments of the present disclosure. Some processes and materials used to form the semiconductor substrate structure 100b are similar to, or the same as, those used to form the semiconductor substrate structure 100a and are not repeated herein. In some embodiments, the projections on the substrate 110 of the first opening 115 and the second opening 125 are completely non-overlapped, so that the dislocations defects, which are grown upward from the first gallium nitride layer 106 and are not blocked by the patterned first hard mask layer 110' (i.e. the dislocations penetrated through the first opening 115 and grown upward into the second gallium nitride layer 116), are completely blocked by the patterned second hard mask layer 120'. Therefore, the dislocations cannot continuously grow into the third gallium nitride layer 126. In comparison with the semiconductor substrate structure 100a, the dislocation density of the third gallium nitride layer 126 in the semiconductor substrate structure 100b is decreased more efficiently.

Figure 3:
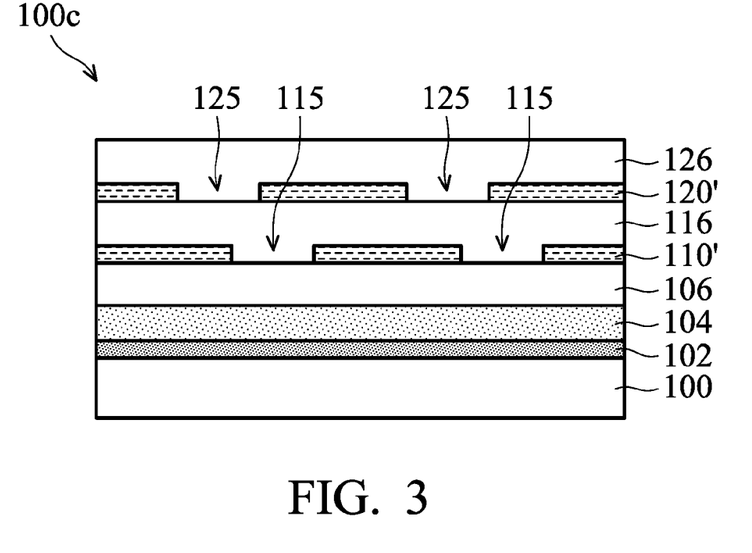
FIG. 3 is a cross-sectional view of a semiconductor substrate structure in accordance with some embodiments of the present disclosure.

FIG. 3 is a cross-sectional view of a semiconductor substrate structure 100c in accordance with some embodiments of the present disclosure. Some processes and materials used to form the semiconductor substrate structure 100c are similar to, or the same as, those used to form the semiconductor substrate structure 100a and are not repeated herein. In some embodiments, the patterned first hard mask layer 110' includes a plurality of additional first openings 115, the patterned second hard mask layer 120' includes a plurality of additional second openings 125, and at least a portion of the projections on the substrate 100 of the first openings 115 and the projections on the substrate 100 of the second openings 125 are non-overlapped.

Figure 4:
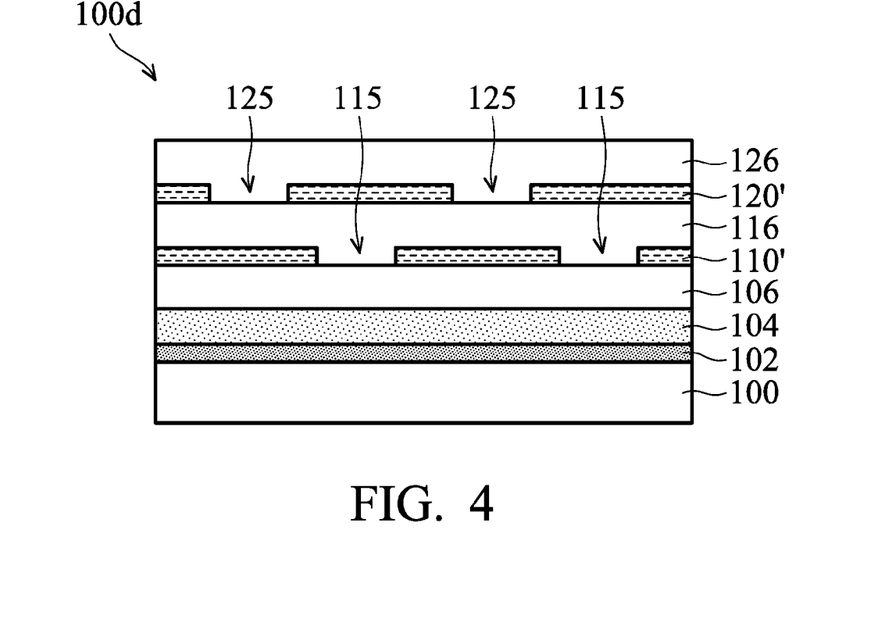
FIG. 4 is a cross-sectional view of a semiconductor substrate structure in accordance with some embodiments of the present disclosure.

FIG. 4 is a cross-sectional view of a semiconductor substrate structure 100d in accordance with some embodiments of the present disclosure. Some processes and materials used to form the semiconductor substrate structure 100d are similar to, or the same as, those used to form the semiconductor substrate structure 100a and are not repeated herein. In some embodiments, the patterned first hard mask layer 110' includes a plurality of the first openings 115, and the patterned second hard mask layer 120' includes a plurality of the second openings 125. The difference between the semiconductor substrate structure 100d and the semiconductor substrate structure 100c is that the projections on the substrate 100 of the first openings 115 and the second openings 125 are completely non-overlapped in the semiconductor substrate 100d. In comparison with the semiconductor substrate structure 100c, the dislocation density of the third gallium nitride layer 126 in the semiconductor substrate structure 100d is decreased more efficiently.

In comparison with the structures of the semiconductor substrates 100a and 100b, the patterned first hard mask layer 110' and the patterned second hard mask layer 120' of the structures of the semiconductor substrates 100c and 100d respectively include a plurality of additional first openings 115 and a plurality of additional second openings 125. The quantities of the openings inside the patterned hard mask layers 110' and 120' may be adjusted based on the actual requirements of the manufacturing process, and they are not limited by the figures of the embodiments.

Figure 5:
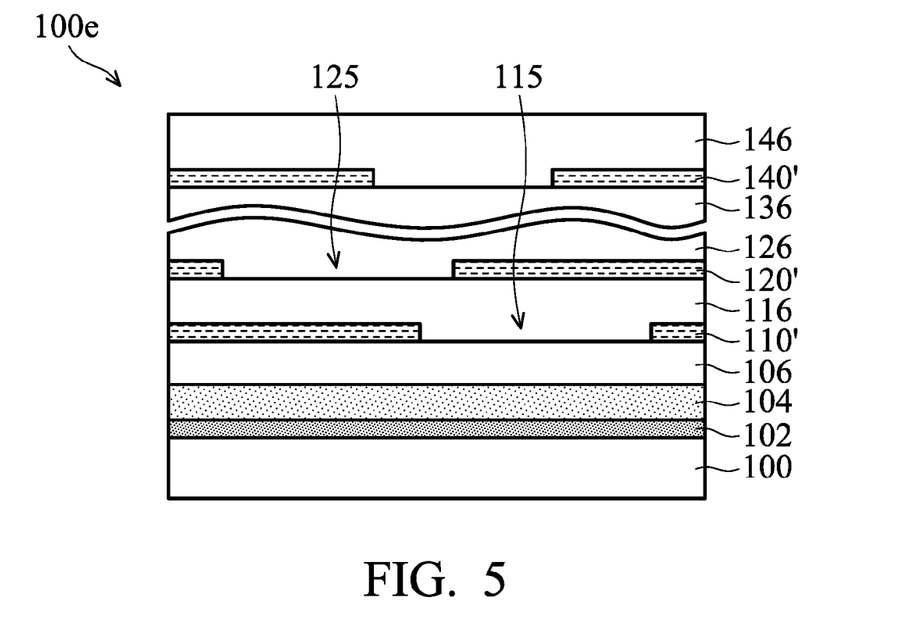
FIG. 5 is a cross-sectional view of a semiconductor substrate structure in accordance with some embodiments of the present disclosure.

FIG. 5 is a cross-sectional view of a semiconductor substrate structure 100e in accordance with some embodiments of the present disclosure. Some processes and materials used to form the semiconductor substrate structure 100e are similar to, or the same as, those used to form the semiconductor substrate structure 100a and are not repeated herein. In some embodiments, a plurality of sets of patterned hard mask layers (such as 140') and gallium nitride layers (such as 136 and 146) are formed on the third gallium nitride layer 126. During the process which the grains of gallium nitride are epitaxially grown, the more sets of the patterned hard mask layers are used to block the dislocation growth inside the gallium nitride, the closer to dislocation free the top gallium nitride layer 146 can be. In some embodiments, two to ten patterned hard mask layers may be formed in the semiconductor substrate structure. If less than two patterned hard mask layers are used, the dislocation density of the top gallium nitride layer 146 may not be decreased sufficiently. If more than ten patterned hard mask layers are used, the costs of time and materials during the process may be too high. As shown in FIG. 5, in some embodiments, the thickness of the top gallium nitride layer 146 is in a range from about 100 nm to about 5 µm, and it can be adjusted based on the requirements of the following processes.

In the present disclosure, the embodiments of the methods for forming structures of semiconductor substrates utilize at least two patterned hard mask layers with interlaced openings to epitaxially grow gallium nitride, so that the dislocations defects caused by lattice mismatch between the substrate, the seed layer and the buffer layer can be blocked. Therefore, the dislocations can be prevented to grow upward into the top gallium nitride layer. During the epitaxial growth process, the dislocation density may be significantly decreased whenever the dislocations are blocked by a patterned hard mask layer. Moreover, the quantity of the openings included in each of the hard mask layer and the total amount of the hard mask layers utilized can be adjusted based on the requirements, and at least a portion of the projections on the substrate of the openings of one patterned hard mask layer and the projections on the substrate of the openings of another adjacent patterned hard mask layer are non-overlapped. The more layers of the patterned hard mask layers are used, the closer to dislocation free the top gallium nitride layer can be. The efficiency and reliability of the devices produced in the following manufacturing steps are thereby enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor substrate structure, comprising:
   a seed layer disposed on a substrate;
   a first gallium nitride layer disposed on the seed layer;
   a patterned first hard mask layer disposed on the first gallium nitride layer, wherein the patterned first hard mask layer includes a first opening;
   a second gallium nitride layer disposed in the first opening and on the patterned first hard mask layer;
   a patterned second hard mask layer disposed on the second gallium nitride layer, wherein the patterned second hard mask layer includes a second opening, and at least a portion of a projection on the substrate of the first opening and a projection on the substrate of the second opening are non-overlapped; and
   a third gallium nitride layer disposed in the second opening and on the patterned second hard mask layer.

2. The semiconductor substrate structure as claimed in claim 1, wherein the projections on the substrate of the first opening and the second opening are completely non-overlapped.

3. The semiconductor substrate structure as claimed in claim 1, wherein the substrate comprises silicon, silicon carbide, gallium nitride, silicon dioxide, sapphire, or a combination thereof.

4. The semiconductor substrate structure as claimed in claim 1, wherein the seed layer comprises aluminium nitride, aluminium oxide, aluminum gallium nitride, silicon carbide, aluminium, or a combination thereof.

5. The semiconductor substrate structure as claimed in claim 1, further comprising:
   a buffer layer disposed between the seed layer and the first gallium nitride layer, wherein the buffer layer comprises aluminium nitride, gallium nitride, aluminum gallium nitride, aluminium gallium indium nitride, on a combination thereof.

6. The semiconductor substrate structure as claimed in claim 1, wherein the patterned first hard mask layer and the patterned second hard mask layer comprise silicon nitride, silicon dioxide, silicon oxynitride, or a combination thereof.

7. The semiconductor substrate structure as claimed in claim 1, wherein a dislocation density of the second gallium nitride layer is lower than a dislocation density of the first gallium nitride layer, and a dislocation density of the third gallium nitride layer is lower than the dislocation density of the second gallium nitride layer.

8. The semiconductor substrate structure as claimed in claim 1, wherein the patterned first hard mask layer further includes a plurality of additional first openings disposed in the patterned first hard mask layer, the patterned second hard mask layer further includes a plurality of additional second openings disposed in the patterned second hard mask layer, and at least a portion of projections on the substrate of the first openings and projections on the substrate of the second openings are non-overlapped.

9. The semiconductor substrate structure as claimed in claim 8, wherein the projections on the substrate of the first openings and the second openings are completely non-overlapped.

10. A method for forming a semiconductor substrate structure, comprising:
    forming a seed layer on a substrate;
    epitaxially growing a first gallium nitride layer on the seed layer;
    forming a patterned first hard mask layer on the first gallium nitride layer, wherein the patterned first hard mask layer includes a first opening;
    epitaxially growing a second gallium nitride layer in the first opening and on the patterned first hard mask layer;
    forming a patterned second hard mask layer on the second gallium nitride layer, wherein the patterned second hard mask layer includes a second opening, and at least a portion of a projection on the substrate of the first opening and a projection on the substrate of the second opening are non-overlapped; and
    epitaxially growing a third gallium nitride layer in the second opening and on the patterned second hard mask layer.

11. The method as claimed in claim 10, wherein the projections on the substrate of the first opening and the second opening are completely non-overlapped.

12. The method as claimed in claim 10, wherein a dislocation density of the second gallium nitride layer is lower than a dislocation density of the first gallium nitride layer, and a dislocation density of the third gallium nitride layer is lower than the dislocation density of the second gallium nitride layer.

13. The method as claimed in claim 10, wherein the first gallium nitride layer and the second gallium nitride layer are formed by a metal organic chemical vapor deposition, a molecular beam epitaxy, or a combination thereof in a temperature range from 800° C. to 1150° C.

14. The method as claimed in claim 10, wherein a plurality of additional first openings is further formed in the patterned first hard mask layer, a plurality of additional second openings is further formed in the patterned second hard mask layer, and at least a portion of projections on the substrate of the first openings and projections on the substrate of the second openings are non-overlapped.

15. The method as claimed in claim 14, wherein the projections on the substrate of the first openings and the second openings are completely non-overlapped.

\* \* \* \* \*